(12) United States Patent
Wang

(10) Patent No.: US 7,279,040 B1
(45) Date of Patent: Oct. 9, 2007

(54) METHOD AND APPARATUS FOR ZINC OXIDE SINGLE CRYSTAL BOULE GROWTH

(75) Inventor: Shaoping Wang, Brookfield, CT (US)

(73) Assignee: Fairfield Crystal Technology, LLC, New Milford, CT (US)

( * ) Notice: Subject to any disclaimer, the term of this patent is extended or adjusted under 35 U.S.C. 154(b) by 29 days.

(21) Appl. No.: 11/438,575

(22) Filed: May 22, 2006

Related U.S. Application Data

(60) Provisional application No. 60/690,980, filed on Jun. 16, 2005.

(51) Int. Cl.
*C30B 11/02* (2006.01)
*C30B 11/04* (2006.01)

(52) U.S. Cl. .......................................... 117/81; 117/83

(58) Field of Classification Search .................. 117/81, 117/83
See application file for complete search history.

(56) References Cited

U.S. PATENT DOCUMENTS

| | | | |
|---|---|---|---|
| 6,936,101 B2 | 8/2005 | Nause et al. ................. | 117/81 |
| 2002/0185055 A1 | 12/2002 | Oka ............................. | 117/36 |

OTHER PUBLICATIONS

Contactless growth of ZnSe single crystaals by physical vapor transport, Su, et al, Journal of Crystal Growth, vol. 213,☐☐Issues 3-4, Jun. 1, 2000, pp. 267-275.*
Nause et al., Pressurized Melt Growth of ZnO Boules, Semiconductor Science Technology, vol. 20, No. 4 (Apr. 2005) at pp. S45-S48.
Maeda et al., Growth of 2 Inch ZnO Bulk Single Crystal by the Hydrothermal Method, Semiconductor Science Technology, vol. 20, No. 4 (Apr. 2005) at pp. S49-S54.
Rojo, Crystal Growth of Bulk ZnO by High Temperature Sublimation Methods, 14$^{th}$ International Conference on Crystal Growth, Grenoble, France, (Aug. 2004).
Djelloul et al., Thermochemical and Green Luminescence Analysis of Zinc Oxide Thin Films Grown on Sapphire by Chemical Vapor Deposition, Turk. J. Phys., vol. 28 (2004) at pp. 309-323.
Grasza et al, Contactless CVT Growth of ZnO Crystals, Phys. Stat, Sol. vol. 2, No. 3 (Feb. 2005) at pp. 1115-1118.

* cited by examiner

*Primary Examiner*—Felisa Hiteshew
(74) *Attorney, Agent, or Firm*—Wiggin and Dana LLP; Gregory S. Rosenblatt

(57) ABSTRACT

There is provided a method for growing one or more single crystal ZnO boules within a physical vapor transport furnace system. This method includes the steps of: (a.) placing a source material at a first end of an interior crucible enclosure and placing one or more seed crystals at an opposing second end of the interior crucible enclosure with the seed crystal and the source material separated by a predetermined distance; (b.) heating the crucible, the one or more seed crystals and the source material to predetermined temperatures in such way that the temperature of the source material is higher than the temperature of the seed crystal; (c.) maintaining a pressure within the interior crucible enclosure through flowing a gas mixture; and (d) maintaining a temperature distribution within the crucible enclosure thereby causing a ZnO boule growth on each one of the one or more seed crystals. The ZnO may be doped with desired additional elements. In alternative embodiments, that other boules, both doped and un-doped, such as ZnSe and ZnS may also be formed.

49 Claims, 7 Drawing Sheets

METHOD AND APPARATUS FOR ZINC OXIDE SINGLE CRYSTAL BOULE GROWTH

CROSS REFERENCE TO RELATED APPLICATION(S)

This patent application claims priority to U.S. Provisional Patent Application Ser. No. 60/690,980 titled "Method and Apparatus for Zinc Oxide Single Crystal Boule Growth" that was filed on Jun. 16, 2005. The subject matter of that provisional patent application is incorporated by reference herein in its entirety.

U.S. GOVERNMENT RIGHTS

Not Applicable.

BACKGROUND OF THE INVENTION

1. Field of the Invention

This invention relates to a method and an apparatus for growing ZnO single crystal boules. More particularly, ZnO single crystals are grown at a high growth rate by physical vapor transport at an elevated temperature, nominally in the range of 1300-1800° C.

2. Description of the Related Art

Zinc oxide (ZnO) has a wide band gap, high stability and high thermal operating range that makes it a suitable material as a semiconductor for fabricating light emitting diodes (LEDs) and laser diodes, photodiodes, power diodes and other semiconductor devices. ZnO single crystal is also a suitable substrate material for epitaxial growth and fabrication of gallium nitride (GaN) and III-V nitride devices, including light emitting diodes (LEDs), laser diodes, high frequency, high power and high temperature devices. In order to manufacture these semiconductor devices, the ZnO is provided as large single crystals that are used to make ZnO wafers. The wafers are then polished into substrates suitable for epitaxial growth and device fabrication. The quality of the semiconductor is highly dependent on the purity and structural characteristics of the ZnO single crystals.

ZnO bulk single crystals have been grown mainly using three known techniques: (a) chemical-assisted vapor transport (CVT), (b) hydrothermal growth, and (c) high-pressure melt growth. ZnO crystals up to 2 inches in diameter have been manufactured using each of these techniques. However, each of the three growth techniques has drawbacks that severely limit its capability to produce high quality ZnO crystals in an efficient manner at low cost.

In CVT technique, a source material and a seed crystal are placed inside a growth furnace in such way that the temperature of the source material is higher than that of the seed and a chemical agent is used as both a sublimation activator and a transport agent to carry vapor species and deposit them onto the seed to form single crystals. CVT technique is useful for growing crystals at low temperatures where the vapor pressure due to sublimation of the materials is too low to allow a growth using a sublimation-and-re-condensation process. Because the vapor pressures of ZnO at temperatures between 900-1200° C. are low, CVT ZnO growth technique uses hydrogen gas (or a mixture of hydrogen and water vapor) as a vapor transport agent so that an appreciable growth rate can be achieved. CVT ZnO is usually carried out in a sealed or a slightly "leaky" quartz crucible. When a "leaky" crucible is used, the ZnO single crystal can be grown without touching the crucible wall, which minimizes the stresses in the crystal. The maximum growth rate in CVT ZnO growth technique using hydrogen gas is about 0.1 mm/hr.

Hydrothermal growth technique is conducted in an aqueous solution inside a high-pressure autoclave at a temperature between 300-400° C. Growth rate of ZnO in hydrothermal technique is about 0.04 mm/hr (1 mm/day). The inherent low growth rates in CVT and hydrothermal techniques for ZnO single crystals severely limit their use in large volume production of ZnO crystal wafers, despite the relative good quality of the ZnO crystals produced by these two techniques.

The third technique for ZnO crystal growth is a high-pressure melt growth technique developed by Cermet, Inc of Atlanta, Ga. In the high-pressure melt growth technique, a ZnO crystal boule is grown from a ZnO melt contained in a water-cooled crucible under an oxygen pressure up to 100 atmospheres. The high oxygen gas pressure is required to suppress evaporation and dissociation of ZnO melt at high temperatures. Although this technique can potentially grow ZnO crystals at a high growth rate (>1 mm/hr), the inherently high dissociation pressure and high evaporation rate of ZnO melt make it difficult to control the crystal growth process and the crystal quality. Moreover, the cost of purchase and operation of the high-pressure melt-growth furnaces for ZnO crystals is expected to be extremely high because of the extremely high gas pressure requirements combined with the high temperature requirements.

In addition to the three above techniques, another growth technique is physical vapor transport (PVT) that is widely used for growing crystals whose vapor pressure due to sublimation is sufficiently high at high temperatures. PVT is essentially a sublimation and re-condensation process, in which a source material and a seed crystal are placed inside a growth furnace in such way that the temperature of the source material is higher than that of the seed so that the source material sublimes and the vapor species diffuse and deposit onto the seed to form single crystals. PVT growth technique has been used for growing many semiconductor crystals, such as zinc selenide (ZnSe) and silicon carbide (SiC) crystals. In both PVT and CVT growth techniques, crystals may also be grown through spontaneous nucleation without using a crystal seed.

PVT growth processes for ZnSe single crystals in the temperature range of 1000-1250° C. have been demonstrated. Similar to CVT growth of ZnO, PVT growth ZnSe with crystal boules not touching the crucibles were also demonstrated in "leaky" crucibles. But the growth rate demonstrated to date in PVT ZnSe growths is less than 0.1 mm/hr, which is too low to be adopted for volume production of ZnSe wafers for semiconductor device applications. The low growth rate in the PVT ZnSe growths is due to the low vapor pressures of ZnSe at the relatively low growth temperatures (1000-1250° C.).

There remains a need for a process and apparatus to rapidly grown ZnO single crystals that do not have the disadvantages of the prior art as described above.

BRIEF SUMMARY OF THE INVENTION

In accordance with the invention, there is provided a method for growing one or more single crystal ZnO boules within a physical vapor transport furnace system. This method includes the steps of: (a.) placing a source material at a first end of an interior crucible enclosure and placing one or more seed crystals at an opposing second end of the interior crucible enclosure with the seed crystal and the source material separated by a predetermined distance; (b.) heating the crucible, the one or more seed crystals and the source material to predetermined temperatures in such way that the temperature of the source material is higher than the temperature of the seed crystal; (c.) maintaining a pressure within the interior crucible enclosure through flowing a gas mixture; and (d) maintaining a temperature distribution within the crucible enclosure thereby causing a ZnO boule growth on each one of the one or more seed crystals.

It is a feature of the invention that ZnO may be doped with desired additional elements.

It is another feature of the invention, that other crystal boules, both doped and un-doped, such as ZnSe and ZnS may also be formed.

It is an advantage of the invention that the boules may be formed into wafers for manufacturing as a non-limiting list, III-nitride-based semiconductor devices (including but not limited to light emitting diodes (LEDs), lasers, UV photodetectors, high frequency devices, high power devices, high temperature devices, spintronics devices, and integrated circuits (ICs)), ZnO-based (e.g. $Zn_xMg_{1-x}O$ (0<X<1) or $Zn_xCd_{1-x}O$ (0<X<1), or a mixture) semiconductor devices (including but not limited to light emitting diodes (LEDs), lasers, UV photodetectors, high frequency devices, high power devices, high temperature devices, spintronics devices, and integrated circuits (ICs)), light emitting diodes (LEDs), lasers, windows, lenses and beam-splitters for high power $CO_2$ lasers.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

Like reference numbers and designations in the various drawings indicated like elements.

DETAILED DESCRIPTION

In PVT growth, raising growth temperature is an effective way to increase the growth rate. However, raising growth temperature encounters two major problems, (a) the deformation of quartz crucible and furnace tube under vacuum at high temperatures and (b) the contamination resulted from the reaction between the vapors and the quartz crucible and quartz furnace chamber walls. The current invention uses a PVT technique to grow ZnO single crystals in the temperature range of 1300-1800° C. in a growth apparatus highly inert to the vapor species resulting from ZnO sublimation and the growth rates in the current invention exceed 0.2 mm/hr.

ZnO sublimes and dissociates at high temperatures (>1200° C.). Therefore, ZnO can potentially be grown using a physical vapor transport technique. A PVT growth, also called sublimation growth, is essentially a sublimation and re-condensation process, without aid of a chemical transport agent. In a PVT growth, a source material, usually in powder form, is placed in one end of a crucible and a seed is placed in the other end of the crucible. The crucible is heated to a sufficiently high temperature in such way that the temperature of the source material is higher than that of the seed. The source material will evaporate into vapor species and the vapor species will deposit onto the seed to form single crystals. In order to use PVT technique for growing ZnO single crystals, two critical requirements have to be satisfied: (1) the vapor pressure of ZnO is sufficiently high in the growth temperature regime, and (2) there is a crucible-thermal-insulation material system compatible with ZnO solid and vapor phase in the growth temperature regime.

To the best knowledge of the inventor, there are neither published data on ZnO sublimation vapor pressures nor any study on ZnO PVT growth process at temperatures higher than 1250° C. Therefore, an analysis of the thermodynamics and kinetics of ZnO sublimation-condensation process at high temperatures was carried out based on published thermodynamic data and kinetics analysis methodology.

Figure 1:
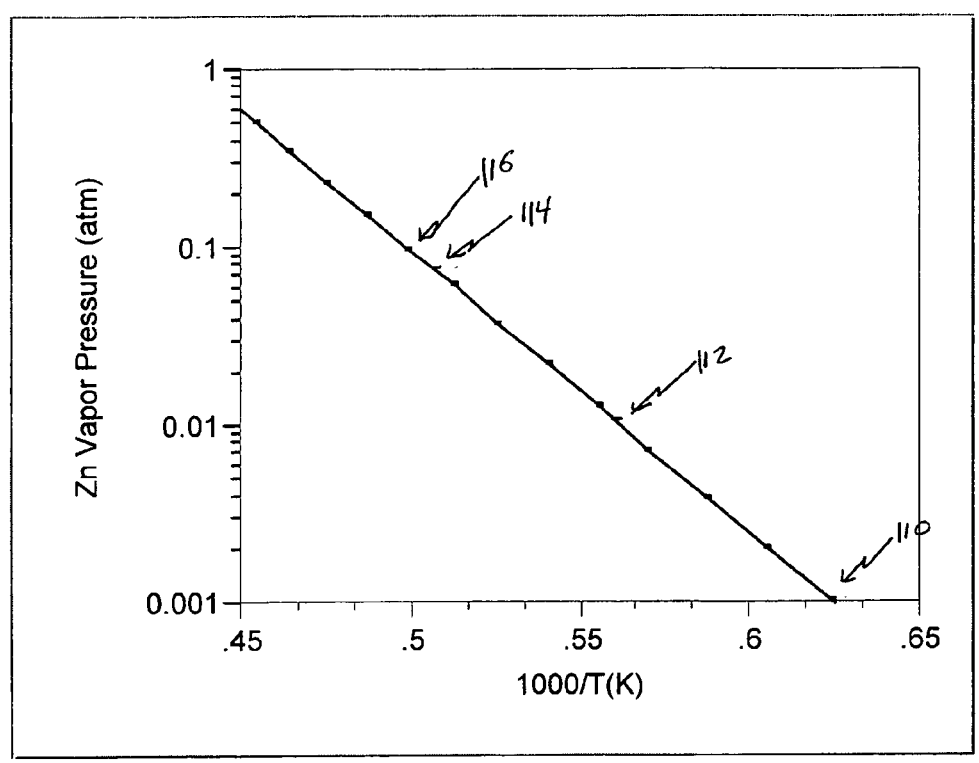
FIG. 1 graphically illustrates a relationship between zinc vapor pressure and temperature.

When ZnO sublimes at high temperatures, it dissociates into two vapor species, Zn vapor and $O_2$ gas. If ZnO is sealed hermetically in a vacuum container and heated to a high temperature, ZnO will sublime into a vapor of Zn and $O_2$ with a molar ratio of 2:1 and the vapor is called a stoichiometric vapor. FIG. 1 shows a plot of the calculated Zn partial pressure versus 1000/T in a stoichiometric vapor in equilibrium with ZnO solid. It can be seen from the plot that, although the Zn vapor pressure above a solid ZnO is very low (<0.001 atm or 0.76 torr) up to 1300° C. (reference numeral 110), it increases rapidly to 0.01 atm (or 7.6 torr) at 1500° C. (reference numeral 112), 0.036 atm (or 27.4 torr) at 1600° C. (reference numeral 114), and 0.1 atm (or 76 torr) at 1700° C. (reference numeral 116), respectively. This result suggests that the sublimation vapor pressure of ZnO solid is sufficiently high so that ZnO can be grown using PVT technique at temperatures higher than 1500° C. Based on the vapor pressure data, the theoretical maximum growth rate for a given temperature difference between the source material and the seed in a PVT ZnO growth can be estimated.

Figure 2:
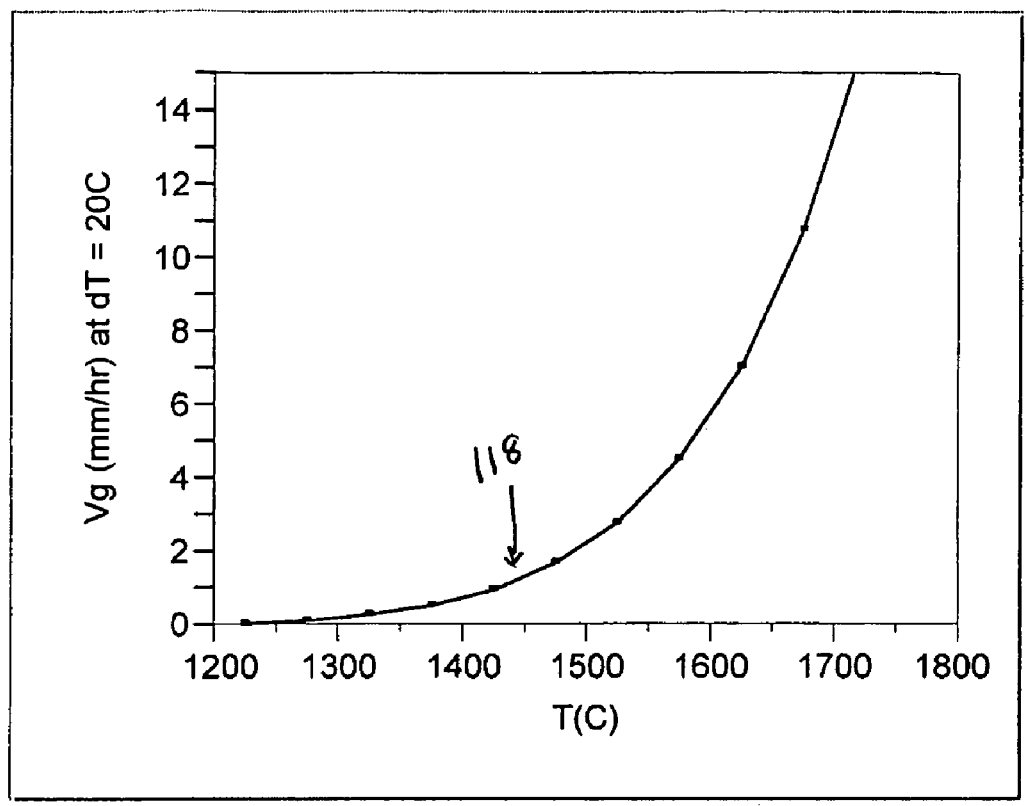
FIG. 2 graphically illustrates a relationship between theoretical maximum ZnO growth rate and temperature when the difference between source temperature and seed temperature is 20° C.

FIG. 2 shows a plot of the maximum PVT ZnO growth rate versus temperature for a source-seed temperature difference of 20° C., where a maximum growth rate of 1.0 mm/hr can be reached when the source temperature is higher than 1450° C. (reference numeral 118) and the growth rate increases rapidly as temperature further increases. In summary, the results of the analysis of thermal dynamics and kinetics of ZnO sublimation and re-condensation process suggests that the sublimation vapor pressure above ZnO solid is sufficiently high at temperatures higher than 1500° C. so that ZnO crystals can be grown using a PVT technique and a growth rate higher than 1 mm/hr can be achieved. When a gas mixture of oxygen and hydrogen is used instead of oxygen, the growth rate of ZnO crystals can be further increased under otherwise the same growth conditions. The advantage of using a gas mixture of oxygen and hydrogen is that one can achieve a significantly higher growth rate at relatively lower temperatures.

Figure 3:
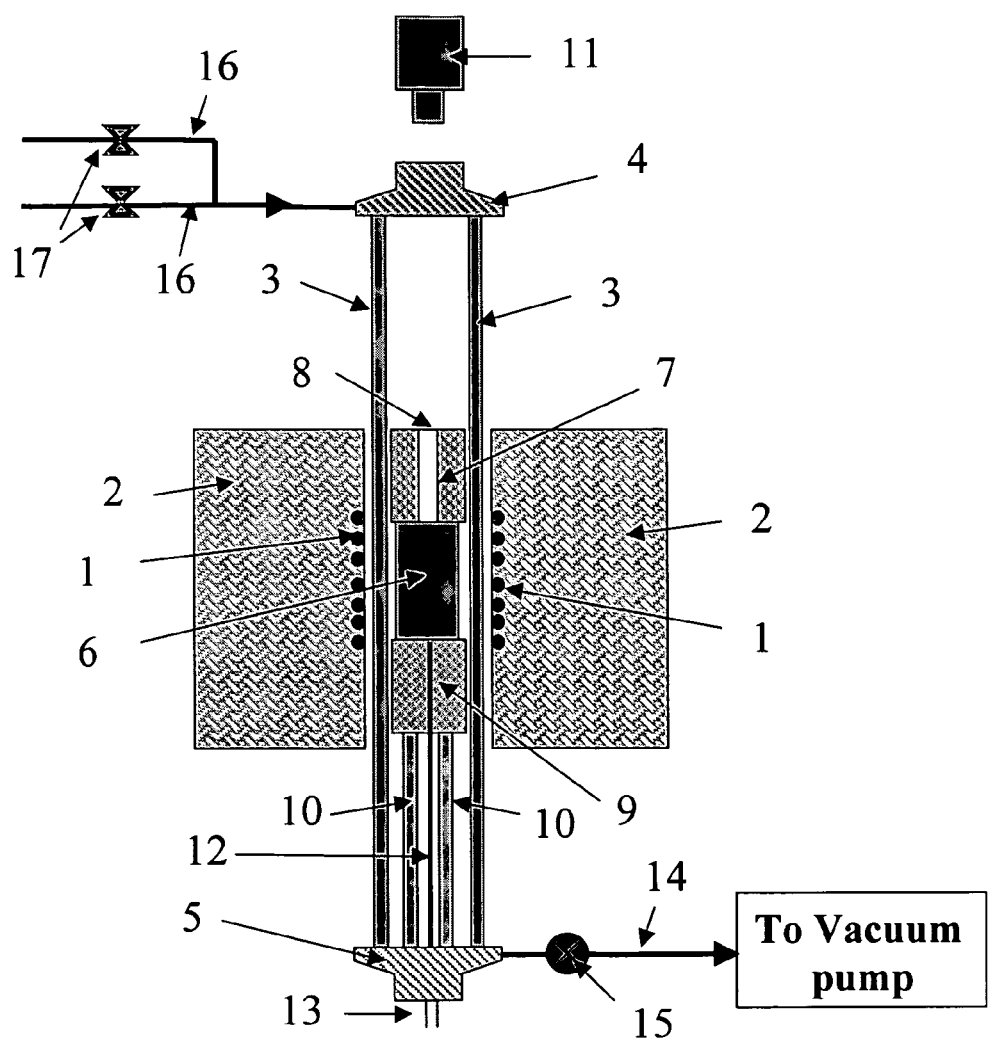
FIG. 3 is a schematic of a PVT growth furnace in accordance with a first embodiment of the invention.

FIG. 3 shows a schematic drawing of the cross sectional view of a PVT furnace for ZnO crystal growth in accordance with a first embodiment of the invention. Components of the PVT growth furnace include: resistive heating element 1, furnace thermal insulation 2, furnace tube 3, top flange, vacuum seal and pyrometer view window 4, bottom flange and vacuum seal 5, growth crucible assembly 6, top thermal insulation 7, pyrometer view hole in top thermal insulation 8, bottom thermal insulation 9, bottom support 10, pyrometer for measuring and controlling the temperature of the top surface of the crucible assembly 11, thermal couple for measuring the temperature of the bottom surface of the crucible assembly 12, thermal couple feed-through 13, exhaust line to vacuum pump 14, exhaust valve for pressure control 15, gas inlet for a gas mixture 16, mass flow controllers for gases 17. By using a $MoSi_2$ heating element and a furnace tube made of refractory ceramic such as alumina or yttrium-stabilized zirconia ($ZrO_2$), a temperature up to 1800° C. can be achieved in the PVT growth furnace.

Figure 4:
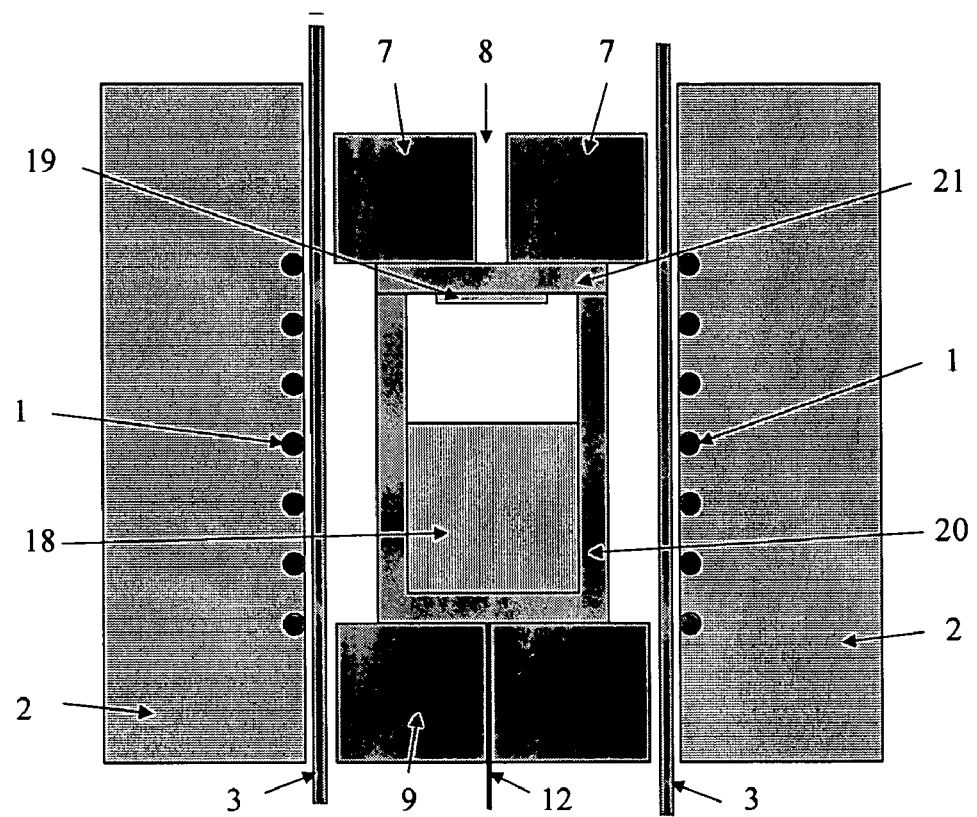
FIG. 4 is a schematic of a first crucible for use with the PVT growth furnace of FIG. 3.

A first embodiment of the growth crucible assembly, in which the ZnO source material and the seed are placed and the boule growth takes place, is schematically shown in detail in FIG. 4. The components in the crucible assembly are: crucible body 20, crucible lid 21, ZnO source material 18, ZnO crystal seed 19, top thermal insulation 7, pyrometer view hole in the top thermal insulation 8, bottom thermal insulation 9, thermal couple for measuring the temperature of the bottom of the crucible 12, furnace tube 3, heating elements 1, and furnace insulation 2. In order to cause the source to sublime and the crystal to grow on the seed, the crucible assembly is heated in such way that the temperature of the source material is higher than that of the seed. In addition, in the PVT growth crucible assembly, the distance between the seed and the surface of the source material facing the seed is an important parameter influencing the outcome of the crystal growth and therefore is usually set at a predetermined value before being placed into the furnace. Typically, this distance is from 5 millimeters to 200 mm, and more preferably between 30 mm and 60 mm.

When alumina (or zirconia) crucibles are used in a PVT growth for ZnO crystals, the difference of coefficients of thermal expansion (CTE) between the alumina crucible and the ZnO single crystal boules grown inside crucible can cause significant stresses in the crystal boules or even cracks of the crystals when the crystal boules are cooled from the growth temperature to room temperature. This is a particularly important issue in the PVT growths using alumina crucibles because the CTE of alumina crucible material is significantly higher than that that of ZnO single crystal. Such a problem arising from CTE difference is often encountered in PVT growths of other crystals.

Figure 5:
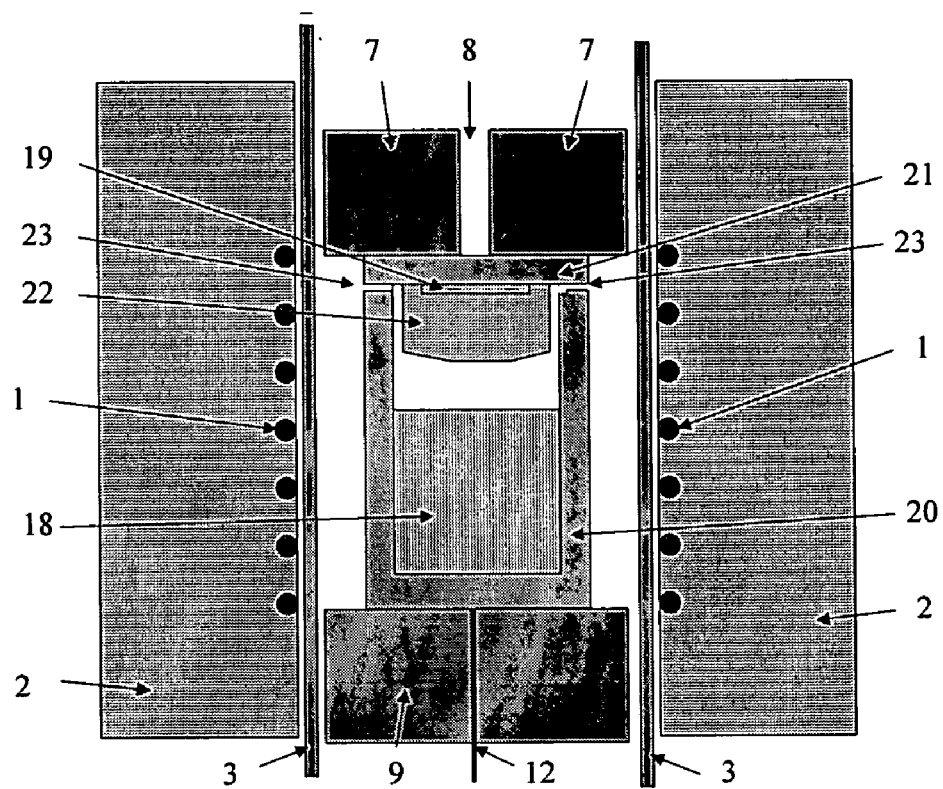
FIG. 5 is a schematic of a second crucible for use with the PVT growth furnace of FIG. 3.

One solution to the CTE problem is to grow the ZnO crystal boules without touching the crucible walls. A crucible design for PVT ZnO boule growth without touching the crucible wall is schematically shown in FIG. 5, where the only components that differ from those depicted in FIG. 4 are: the crystal boule 22, the gap (not drawn to scale) between the crucible body and the crucible lid 23. In this embodiment, the gap is from 0.1 mm to 1 mm and preferably from 0.1 mm to 0.25 mm. This crucible design, or a variation of the design, allows a small amount of vapor to leak out the crucible during PVT growth so that the crystal boule being grown inside the crucible has no physical contact with the crucible sidewall and therefore the crucible wall will not exert any force to the crystal boule during post-growth cooling period.

The electrical properties, particularly resistivity, of ZnO crystals are strongly influenced by the stoichiometry of the crystals. The stoichiometry of ZnO depends strongly on the oxygen partial pressure in the vapor phase both during PVT growth and post-growth cooling (and annealing). ZnO crystals usually have excess Zn and exhibit n-type conduction. In PVT ZnO growth, it is expected that the higher the oxygen partial pressure during growth, the less the excess Zn in ZnO crystals, leading to a higher resistivity of the ZnO crystals. Therefore, the oxygen partial pressure during PVT ZnO growth is set to a proper value so that a ZnO single crystal with a desired range of resistivities can be produced. Typically, the oxygen partial pressure is from 1 torr to 800 torr, and preferably between 10 torr and 500 torr. The resistivity of ZnO crystals produced using the PVT technique in the current invention is in the range of $0.001-1\times10^{12}$ ohm-cm under different oxygen partial pressure.

For certain device applications, semi-insulating (resistivity higher than $1\times10^5$ ohm-cm) substrates are desirable. Semi-insulating ZnO crystals can be grown using the PVT technique in the current invention by adding single or multiple dopants, exemplary dopants include lithium (Li), sodium (Na) and potassium (K). The current invention also allows growth of ZnO crystals of a high purity and a highly stoichiometric composition and such ZnO crystals are referred to as intrinsic semiconductors. Intrinsic ZnO crystals are semi-insulating. For some other device applications, ZnO substrates with p-type conduction are desirable. ZnO crystals of p-type conduction can be grown using the PVT technique in the current invention by adding single or multiple dopants, exemplary dopants include gallium (Ga), aluminum (Al) and nitrogen (N).

An inert gas, such as a noble gas (argon, helium) or nitrogen, can slow down PVT growth rate because inert gas slows down the diffusive transport of the sublimation vapor species towards the seed. Therefore, an inert gas can be used alone or in a mixture with oxygen in ZnO PVT growth in the current invention to regulate the growth rate. For example, the growth on a ZnO seed can be regulated through varying the partial pressure of an inert gas in the growth chamber during the initial growth period so that the growth rate on the seed is increased gradually to a desired value so that crystalline defects in the newly grown crystals can be minimized or eliminated.

Since the substrate crystal quality strongly influences performance of semiconductor devices fabricated on the substrates, PVT ZnO crystals with low crystalline defects are desirable for device applications. One commonly used technique for revealing and quantifying crystalline defects in semiconductor crystals is chemical etching. This method reveals defects such as dislocations, grain boundaries, voids, and inclusions in the crystals. Defects, particularly dislocations, are revealed as etch-pits and the densities of etch-pits can then be determined and used as a measure of dislocation density in the crystals. ZnO crystals can be etched using a solution of a chemical acid, such hydrogen chloride (HCl) solution. Usually, compound semiconductor single crystal substrates with etch-pit densities less than $1\times10^6$ $cm^{-2}$ are considered useful for semiconductor device applications.

Figure 6:
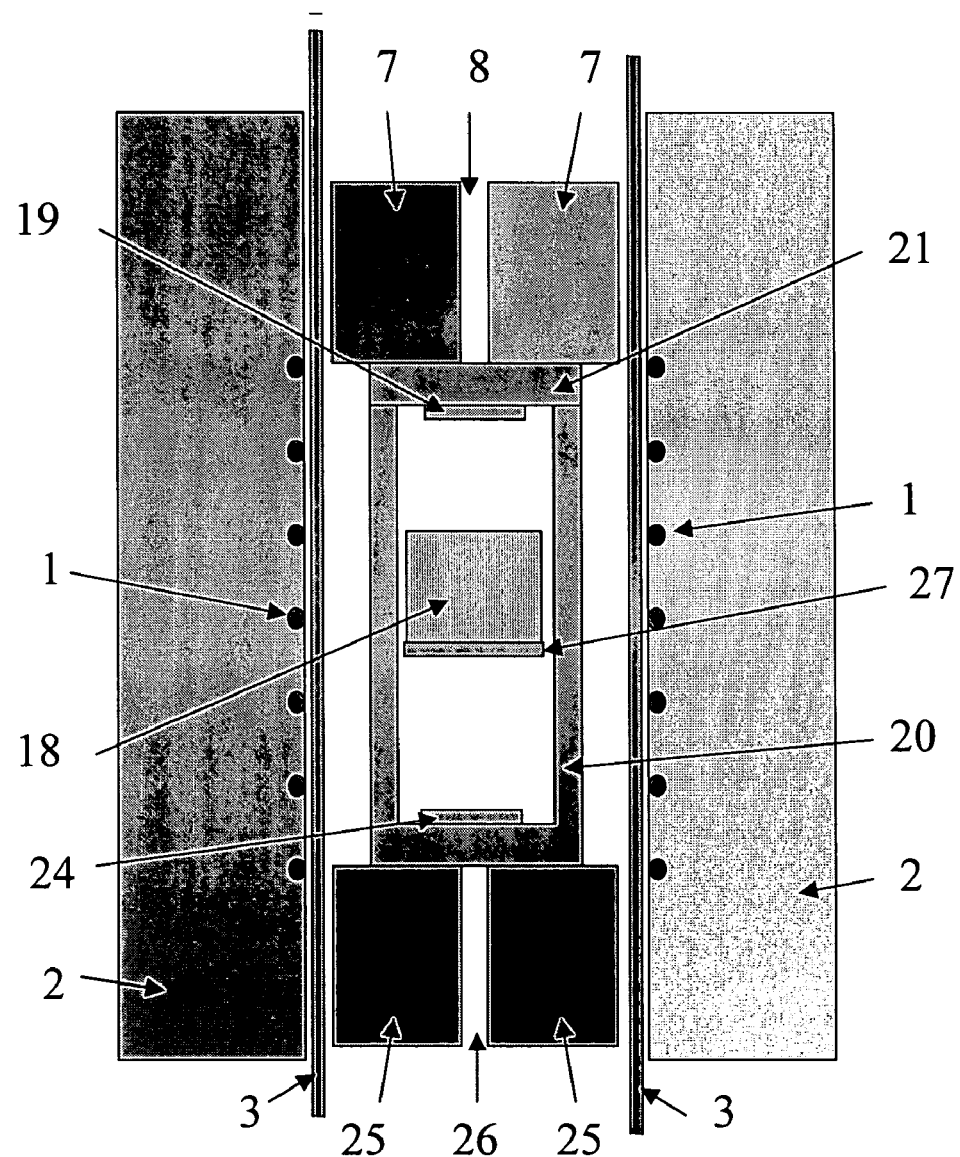
FIG. 6 is a schematic of a PVT growth furnace in accordance with a second embodiment of the invention.

In alternative embodiments of the invention, the PVT growth furnace and crucible assembly is arranged so that two crystal boules are grown per PVT furnace per growth run. There are two different ways to arrange the PVT growth setup: the vertical growth arrangement and the horizontal arrangement. FIG. 6 shows a vertically arranged PVT growth setup for growing two crystal boules per growth run. The components inside the growth furnace chamber that differ from those depicted in FIG. 4 are: the second seed on the bottom of the crucible 24, the ZnO source support in the middle of the crucible 27, bottom thermal insulation 25, and the pyrometer view-hole in bottom insulation 26.

Figure 7:
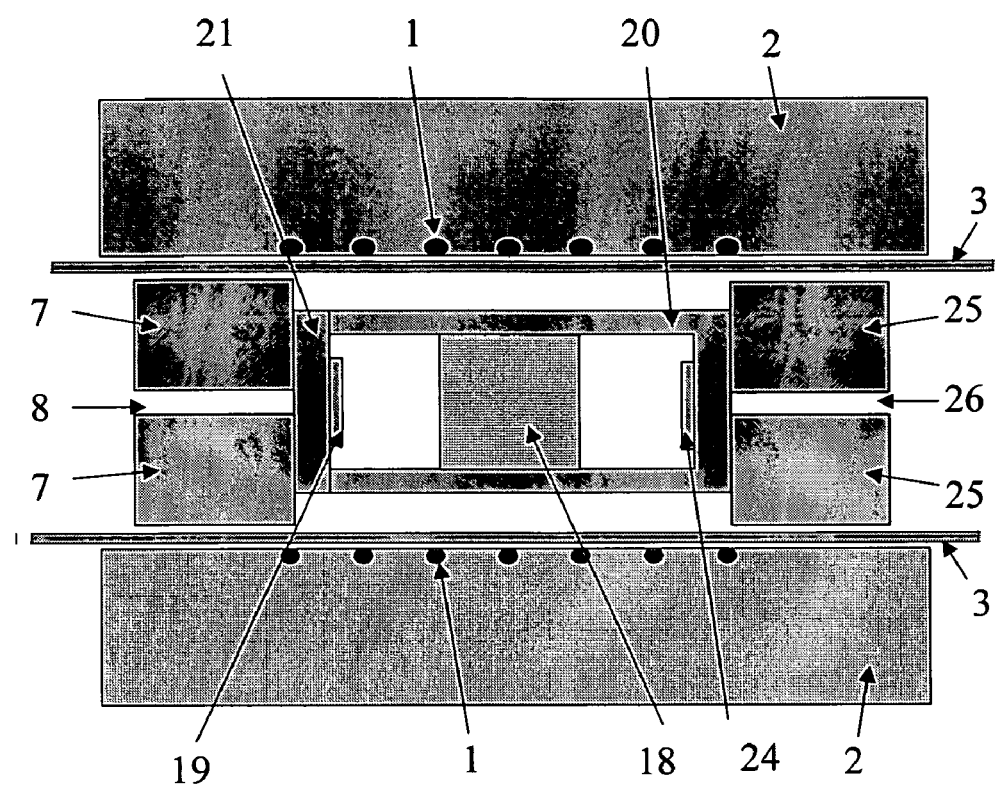
FIG. 7 is a schematic of a PVT growth furnace in accordance with a third embodiment of the invention.

FIG. 7 shows a horizontally arranged PVT growth furnace for growing two boules per growth run. The horizontally arranged PVT furnace is essentially the same as the vertically arranged PVT furnace depicted in FIG. 6 but the furnace axis is turned by 90 degrees. When using any one of the two growth setups for growing two boules per growth run, it is essential that the temperatures of the two seeds are maintained at approximately the same temperature so that the characteristics of the two crystal boules are substantially the same. This is achieved through adequately arranging the crucible and thermal insulation to create a desirable thermal field and a desired vapor transport route.

EXAMPLES

The invention will be better understood by the following example.

Example 1

To demonstrate PVT ZnO crystal growth using the apparatus described in FIGS. 3 and 4 above, PVT growth experiments were carried out in a 99.8% purity alumina crucible with an alumina lid placed on top of the crucible under an air pressure of less than 2 torr with ZnO source temperatures in the range of 1400-1670° C. The ZnO source material used was 99.9% ZnO powder from Alfa Aesar (Ward Hill, Mass.). The effects to be observed in these experiments are the amount of ZnO deposit on the crucible lids and the weight loss of ZnO source powder from the crucibles.

It was found that ZnO polycrystalline deposits up to 0.5 mm in thickness were grown directly onto the alumina lids in a period of 2-3 hours at a source temperature higher than 1550° C. and an average growth rate up to 0.2 mm/hr was achieved. The weight loss of ZnO source powder increased sharply when the source temperature was higher than 1600° C. In a growth experiment in which the source temperature was approximately 1670° C., ZnO source powder of about 75 g completely evaporated and exited the crucible through the gap between the crucible and the lid in about 3 hours. There was a uniform, transparent polycrystalline ZnO deposit of about 0.5 mm in thickness on the crucible lid and there were cracks visible to naked eyes in the ZnO deposit, presumably due to the stresses caused by the difference in thermal expansion between the ZnO deposit and the alumina lid during post growth cooling.

In another growth run under an air pressure of about 40 torr and at a source temperature of about 1650° C., a greenish ZnO deposit about 0.15 mm in thickness was grown on the crucible lid in about 0.75 hour. The ZnO deposit was easily detached from the alumina lid after growth and several free-standing ZnO thick films of areas up to 5×5 mm² were obtained.

In terms of electrical behavior, some ZnO polycrystalline deposits in these experiments were found electrically conducting and others insulating. In terms of crucible compatibility, there was no evidence of chemical reaction between the Zn vapor and the high purity alumina crucibles/lids in the temperature range in all the experiments and the alumina crucibles showed no weight change after repeated use in the experiments. But severe degradation of the alumina fiber insulation materials (approximately 97% aluminum oxide) was observed, which was attributed to the reaction between the Zn vapor and the impurities (including silicon dioxide, and a total weight percentage of approximately 2-3%) in the alumina fiber insulation materials. The alumina fiber insulation material can be replaced with high purity (at least 99.8%) aluminum oxide insulation powder, which will have the same inertness as the alumina crucible material.

Although all the growth experiments discussed above were performed in unsealed alumina crucibles and a large portion of the vapor from ZnO sublimation exited from the crucible in each growth, an average growth rate of about 0.2 mm/hr was still achieved. It is therefore expected that, once the crucibles are sealed to prevent significant loss of vapor, a growth rate substantially higher than 0.2 mm/hr can be achieved under similar growth conditions. And the growth rate in ZnO PVT growth can be further increased when the temperature of the source material is further increased.

In PVT growth, usually a seed crystal is used to control nucleation and crystallographic orientation of the newly grown crystal. If a ZnO crystal seed is attached to the lid, a ZnO single crystal boule with the same crystal orientation as that of the seed crystal can be grown under otherwise the same growth conditions as that in the above PVT growth experiments.

One or more embodiments of the present invention have been described. Nevertheless, it will be understood that various modifications may be made without departing from the spirit and scope of the invention. For example, ZnSe and ZnS boules may be manufactured. Accordingly, other embodiments are within the scope of the following claims.

What is claimed is:

1. A method for growing one or more single crystal ZnO boules within a physical vapor transport furnace system, comprising the steps of:
   a.) placing a source material at a first end of an interior crucible enclosure and placing one or more seed crystals at an opposing second end of the interior crucible enclosure with said seed crystal and said source material separated by a distance;
   b.) heating said crucible, said one or more seed crystals to a first temperature, and said source material to a second temperature such that the second temperature is higher than the first temperature;
   c.) maintaining a pressure with in said interior crucible enclosure through flowing a gas mixture; and
   d.) maintaining a temperature difference within the said crucible enclosure thereby causing a ZnO boule growth on each one of said one or more seed crystals.

2. The method of claim 1 wherein said source material is heated to the second temperature which is in the range of 1300-1800° C.

3. The method of claim 1 wherein said furnace system includes a vacuum-tight enclosure made of an alumina-base ceramic or an yttrium-stabilized zirconia ($ZrO_2$) ceramic.

4. The method of claim 1 wherein said furnace system includes a vacuum-tight enclosure made from a material selected from the group consisting of magnesium oxide ceramics, ALON, Mullite, sapphire, and other refractory metal oxides having melting point higher than the source material temperature.

5. The method of claim 1 wherein said ZnO source material is selected to be ZnO powder.

6. The method of claim 5 wherein said ZnO source material is selected to be high purity (greater then 99.5%, by weight) ZnO powder.

7. The method of claim 5 wherein said ZnO source material is in chunk form or in ingot form.

8. The method of claim 1 wherein said crucible is completely sealed and vacuum-tight.

9. The method of claim 1 wherein said crucible is partially sealed and "leaky" so that the inside of the crucible can be evacuated to achieve vacuum or be filled with gases.

10. The method of claim 1 including selecting said seed crystal to be a ZnO single crystal.

11. The method of claim 10 including selecting said seed crystal to have an orientation selected from the group consisting of (0001) with zinc-face as the crystal growth surface, or (0001) with oxygen-face as the crystal growth surface, or (11-20), or (1-100), or any defined crystallographic orientation.

12. The method of claim 1 wherein said seed crystal is generated through spontaneous nucleation in the initial crystal growth period.

13. The method of claim 1 wherein said temperature difference between the first temperature and the second temperature is in the range of 2-200° C.

14. The method of claim 1 wherein the distance between the seed and the surface of the source material facing the seed is no less than 2 mm.

15. The method of claim 1 wherein said pressure of the said gas mixture is in the range of 0.01-800 torr.

16. The method of claim 15 wherein gas mixture is pure oxygen.

17. The method of claim 15 wherein said gas mixture is selected from the group consisting of a mixture of oxygen and hydrogen and a mixture of oxygen and water vapor.

18. The method of claim 15 wherein gas mixture is a mixture of oxygen, hydrogen and an inert gas.

19. The method of claim 18 wherein said inert gas is argon, nitrogen or helium.

20. The method of claim 1 wherein said etch-pit density of the said ZnO crystal boule is less than $1\times10^6$ cm$^{-2}$.

21. The method of claim 20 wherein said etch-pit density of the said ZnO crystal boule is less than $1\times10^3$ cm$^{-2}$.

22. The method of claim 1 including forming said ZnO crystal boule to be substantially dislocation-free.

23. The method of claim 1 including having said resistivity of the said ZnO crystal boule in the range of 0.001-$1\times10^{12}$ ohm-cm.

24. The method of claim 23 wherein said ZnO crystal boule is semi-insulating with a resistivity higher than $1\times10^5$ ohm-cm.

25. The method of claim 1 wherein said crystal boule is doped with electrically active dopants.

26. The method of claim 25 wherein said source material is mixed with at least one dopant material in a solid form.

27. The method of claim 25 wherein crystal boule is doped intentionally with at least one electrically active dopant.

28. The method of claim 25 wherein said method is used for growth of $Zn_xMg_{1-x}O$ (0<X<1) single crystal boules.

29. The method of claim 25 wherein said method is used for growth of $Zn_xCd_{1-x}O$ (0<X<1) single crystal boules.

30. The method of claim 1 including forming said ZnO crystal boule to be n-type.

31. The method of claim 1 including forming said ZnO crystal boule to be p-type.

32. The method of claim 1 wherein said ZnO crystal boule is an intrinsic semiconductor.

33. The method of claim 1 wherein said average growth rate of the said boule growth is in the range of 0.2-2.0 mm/hr.

34. The method of claim 1 wherein said crystal boule is substantially not in physical contact with the said growth crucible wall, otherwise known as "boule growth without touching the crucible wall".

35. The method of claim 34 wherein said crucible is a leaky crucible so that a "boule growth without touching the crucible wall" is achieved.

36. The method of claim 1 wherein said method is used for growing two ZnO crystal boules per growth run at substantially the same first temperature.

37. The method of claim 36 including selecting said apparatus to be effective for growing two crystal boules per growth run in a horizontal or a vertical arrangement.

38. The method of claim 1 wherein said ZnO single crystals are used as substrates for fabricating III-nitride-based semiconductor devices, including but not limited to light emitting diodes (LEDs), lasers, UV photodetectors, high frequency devices, high power devices, high temperature devices, spintronics devices, and integrated circuits (ICs).

39. The method of claim 1 wherein said ZnO single crystals are used as substrates for fabricating ZnO-based (e.g. $Zn_xMg_{1-x}O$ (0<X<1) or $Zn_xCd_{1-x}O$ (0<X<1), or a mixture) semiconductor devices, including but not limited to light emitting diodes (LEDs), lasers, UV photodetectors, high frequency devices, high power devices, high temperature devices, spintronics devices, and integrated circuits (ICs).

40. A method for the growth of ZnSe single crystal boules within a physical vapor transport system having a source temperature range of 1300° C. to its melting point, comprising the steps of:

a.) placing a source material at a first end of an interior crucible enclosure and placing one or more seed crystals at an opposing second end of the interior crucible enclosure with said seed crystal and said source material separated by a distance;

b.) heating said crucible, said one or more seed crystals to a first temperature, and said source material to a second temperature that is in the range of 1300° F. to the source material melting point such that the second temperature is higher than the first temperature;

c.) maintaining a pressure with in said interior crucible enclosure through flowing an argon gas; and d.) maintaining a temperature difference within the said crucible enclosure thereby causing a ZnSe boule growth on each one of said one or more seed crystals.

41. The method of claim 40 wherein said method is used for growth of $ZnSe_xS_{1-x}$ (0<X<1) single crystal boules with the second temperature in a range of from 1300° C. to the melting point.

42. The method of claim 40 wherein said method is used for growth of ZnSe polycrystalline boules with the second temperature in a range of from 1300° C. to its melting point.

43. The method of claim 40 wherein said ZnSe, ZnS, and $ZnSe_xS_{1-x}$ (0<X<1) single crystals are used as substrates for fabricating semiconductor devices, including but not limited to light emitting diodes (LEDs) and lasers.

44. The method of claim 40 wherein said ZnSe, ZnS, and $ZnSe_xS_{1-x}$ (0<X<1) polycrystalline boules or single crystal boules are used to fabricate IR optical components, including but not limited to windows, lenses and beam-splitters for high power $CO_2$ lasers at the wavelength of approximately 10.6 µm.

45. A method for the growth of ZnS single crystal boules within a physical vapor transport system having a source temperature range of 1300° C. to its melting point, comprising the steps of:

a.) placing a source material at a first end of an interior crucible enclosure and placing one or more seed crystals at an opposing second end of the interior crucible enclosure with said seed crystal and said source material separated by a distance;

b.) heating said crucible, said one or more seed crystals to a first temperature and said source material to a second temperature in such that the second temperature is higher than the first temperature;

c.) maintaining a pressure with in said interior crucible enclosure through flowing an argon gas; and d.) maintaining a temperature difference within the said crucible enclosure thereby causing a ZnS boule growth on each one of said one or more seed crystals.

46. The method of claim 45 wherein said method is used for growth of ZnS polycrystalline boules with the second temperature in a range of from 1300° C. to its melting point.

47. The method of claim 46 wherein said method is used for growth of $ZnSe_xS_{1-x}$ (0<X<1) polycrystalline boules with the second temperature in a range of from 1300° C. to the melting point.

48. The method of claim 45 wherein said ZnSe, ZnS, and $ZnSe_xS_{1-x}$ (0<X<1) single crystals are used as substrates for fabricating semiconductor devices, including but not limited to light emitting diodes (LEDs) and lasers.

49. The method of claim 45 wherein said ZnSe, ZnS, and $ZnSe_xS_{1-x}$ (0<X<1) polycrystalline boules or single crystal boules are used to fabricate IR optical components, including but not limited to windows, lenses and beam-splitters for high power $CO_2$ lasers at the wavelength of approximately 10.6 µm.

* * * * *